United States Patent [19]

Nelson

[11] Patent Number: 4,724,026
[45] Date of Patent: Feb. 9, 1988

[54] PROCESS FOR SELECTIVE TRANSFER OF METALLIC FOILS TO XEROGRAPHIC IMAGES

[75] Inventor: Marshall A. Nelson, Lansing, Ill.

[73] Assignee: Omnicrom Systems Corporation, Ashland, Mass.

[21] Appl. No.: 918,365

[22] Filed: Oct. 14, 1986

Related U.S. Application Data

[63] Continuation-in-part of Ser. No. 698,241, Feb. 5, 1985, abandoned.

[51] Int. Cl.$^4$ .............. B44C 1/16; B44C 1/17; G03C 3/00
[52] U.S. Cl. .................. 156/233; 156/234; 156/239; 430/12; 430/16
[58] Field of Search ........... 156/150, 151, 233, 230, 156/234, 235, 239, 241, 249, 273.7, 276, 283, 289, 344; 430/2, 12, 16, 45, 49; 427/56.1; 428/200, 202, 344, 913, 914, 915; 29/DIG. 1, DIG. 2

[56] References Cited

U.S. PATENT DOCUMENTS

| | | | |
|---|---|---|---|
| 2,955,035 | 10/1960 | Walkup et al. | 430/49 |
| 2,955,052 | 10/1960 | Carlson et al. | 101/DIG. 13 |
| 2,955,531 | 10/1960 | Bogdonoff | 101/DIG. 13 |
| 3,080,270 | 3/1963 | Lorenz | 156/233 |
| 3,088,402 | 5/1963 | Newman | 430/49 |
| 3,357,830 | 12/1967 | Bixby | 430/45 |
| 3,519,512 | 7/1970 | Downs | 156/249 |
| 3,703,603 | 11/1972 | Levesoue et al. | 156/249 |
| 3,753,850 | 8/1973 | Brunet | 156/233 |
| 3,764,309 | 10/1973 | Tamai et al. | 430/45 |
| 3,840,385 | 10/1974 | Yosida | 430/45 |
| 4,006,267 | 2/1977 | Kunz | 427/56.1 |
| 4,012,552 | 3/1977 | Watts | 156/234 |
| 4,028,165 | 6/1977 | Rosenfeld | 156/234 |
| 4,040,828 | 8/1977 | Evans | 430/45 |
| 4,053,344 | 10/1977 | Hirahara | 156/247 |
| 4,330,352 | 5/1982 | Grimes et al. | 156/247 |
| 4,465,538 | 8/1984 | Schmoock | 156/234 |
| 4,484,970 | 11/1984 | Burzlaff et al. | 156/234 |

Primary Examiner—Donald E. Czaja
Assistant Examiner—L. Falasco
Attorney, Agent, or Firm—Willian Brinks Olds Hofer Gilson & Lione Ltd.

[57] ABSTRACT

The present invention is directed to a method for selectively transferring metallic foil and xerographic images on a receiving substrate such as paper. The method generally comprises providing a transfer sheet (including a metallic film) and a receiving substrate (including xerographic images disposed thereon.) The receiving substrate is placed in face-to-face contact with the transfer sheet to form a sandwich with the xerographic images on the inside. the sandwich is then fed through an apparatus, where heat and pressure are applied, causing the xerographic images to tackify and causing the metal film from the transfer sheet to selectively adhere to the xerographic images.

20 Claims, 8 Drawing Figures

PROCESS FOR SELECTIVE TRANSFER OF METALLIC FOILS TO XEROGRAPHIC IMAGES

CROSS REFERENCE TO RELATED APPLICATION

This application is a continuation-in-part of co-pending application Ser. No. 06/698,241, filed Feb. 5, 1985, abandoned.

BACKGROUND OF THE INVENTION

1. Field of the Invention

The present invention relates generally to the art of selective transfer processes, and specifically to the selective transfer of metallic foils to xerographic images.

2. Background Art

The method for obtaining a copy of an original by electrostatic imaging is well known in the art, and is described in U.S. Pat. Nos. 2,397,691 and 2,357,809 to Carlson. The method generally comprises:

(1) electrostatically charging a photosensitive plate;

(2) irradiating the plate with actinic radiation to dissipate the charge in exposed areas and form an electrostatic image in unexposed areas;

(3) dusting the plate with a pigmented resin powder carrying an opposite electrostatic charge to the charge of the electrostatic image, such that the powder is attracted and then attached to the image area;

(4) transferring the image from the plate to a copy sheet by mechanical or electrical means; and (5) fixing the powdered image on the copy sheet by heat or chemical treatment.

Various patents have disclosed methods for obtaining color copies. For example, U.S. Pat. No. 3,057,720 to Hayford et al. discloses a method for xerographic color reproduction, wherein the same general xerographic steps as outlined above are used in combination with the konw "subtractive principle" of mixing primary colors, in a manner fully described in the '720 patent. U.S. Pat. No. 3,088,402 to Newman discloses a method of producing an imaged hectograph master by superposing a transfer sheet coated with a transferable layer of dye-carrying composition upon a sheet including a xerographic image and heating the sheets to render the xerographic image tacky. The transfer sheet is then stripped from the resulting imaged hectograph master. Similarly, U.S. Pat. No. 4,006,267 to Kurz, deceased, discloses placing a colored transfer donor in face-to-face contact with an image portion of a xerographic copy, heating the xerographic image, and removing the transfer donor to transfer the color of the donor layer to the image portion of the xerographic copy.

Methods for the selective transfer of metallic foils have also been disclosed. For example, U.S. Pat. No. 4,053,344 to Harahara discloses placing a stamping foil, having an adhesive on one side, over ink which is dried until tacky. The adhesive is of a type which reacts with and adheres to the ink but does not adhere to the article. U.S. Pat. No. 3,519,512 to Downs similarly discloses using an ink-type "sensitizer" to adhere metallic foil to a substrate.

However, the process of selectively transfering metallic foils to a xerographic toner image is not specifically disclosed by the prior art. There are several difficulties encountered while developing a transfer sheet that consistently transfers a well defined metallic overlay to a xerographic toner image substrate. This is particularly true when providing a selective transfer to a toner image produced by common office photocopy equipment.

One difficulty encountered is that many toners include a release component to aid in removal of the toner from the plate once the toner is bound to the copy sheet. The copy sheet is generally a porous paper, to which the toner powders mechanically adhere as they are fused. Thus the toner can still bond to the copy sheet while the release component prevents adherence of the toner to photocopy machine elements.

Beside release components included in the makeup of the toner itself, silicone oil is often applied to machine parts to prevent the toner from sticking to them. During operation of the photocopy machine, this silicone oil coats the exposed surface of the xerographic image. Thus, when attempting to bond a metallic foil to the image, the silicone oil acts to prevent such bonding.

Consistent coverage of the xerographic image is difficult to achieve because of differences in the toner compositions of different manufacturers, differences in photocopy machine operation, etc. If the metallic foil adheres too readily, bridging occurs. Bridging is a term used to described the situation where a single continuous portion of metallic film adheres to two or more discontinuous portions of the xerographic toner image, covering a portion of the copy sheet which does not have toner on it. A simple illustration of bridging is the filling in or images of letters or numbers normally having a void space, such as "a", "e", "o", etc.

On the other hand, the makeup of a toner xerographic image of one particular letter or other element of the total image is seldom uniform across the surface area of the letter or element. Thus, if the metallic film does not adhere well enough to the toner, only parts of the image will be selectively coated.

SUMMARY OF THE INVENTION

A method is provided for forming imamges overlaid with metallic foil. According to the method of the present invention, a sheet comprising xerographic images is provided and placed in face-to-face contact with a metal transfer sheet, to form a sandwich with the xerographic images on the inside. Heat and pressure are applied to the sandwich, causing the xerographic images to become tacky and causing the metallic foil to selectively adhere to the images. The remainder of the transfer sheet is then stripped away from the resulting decorated sheet comprising xerographic images overlaid with metallic foil.

In the preferred embodiment of the invention, the metal transfer sheet is provided with an adhesive of high filler content resin which has been found to produce good quality transfers to xerographic images produced by a wide variety of toners and photocopy machinery.

An important object of the invention is to provide a quick and easy method of selectively coating the image portions of a substrate with metallic foil. This object is accomplished in accordance with the present invention, as for example in the presently preferred embodiment, by passing the sandwich through heated rollers at a suitable temperature and pressure for transferring the foil to the xerographic images.

Further objects and attendant advantages will best be understood by a study of the appended detailed description of the preferred embodiments, taken together with the drawings.

BRIEF DESCRIPTION OF THE DRAWINGS

FIG. 4 shows a diagrammatic cross-sectional view of a roller pair for use in accordance with an embodiment of the present invention.

FIG. 5 shows a diagrammatic cross-sectional view of a roller pair and a pre-heating lamp for use in accordance with an embodiment of the present invention.

FIG. 6 shows a diagrammatic cross-sectional view of a roller pair and a pre-heating oven for use in accordance with an embodiment of the present invention.

FIG. 7 shows a diagrammatic cross-sectional view of a roller and platen pair for use in accordance with an embodiment of the present invention.

FIG. 8 shows a diagrammatic cross-sectional view of a platen pair for use in accordance with an embodiment of the present invention.

DETAILED DESCRIPTION OF THE PREFERRED EMBODIMENTS

Figure 1:
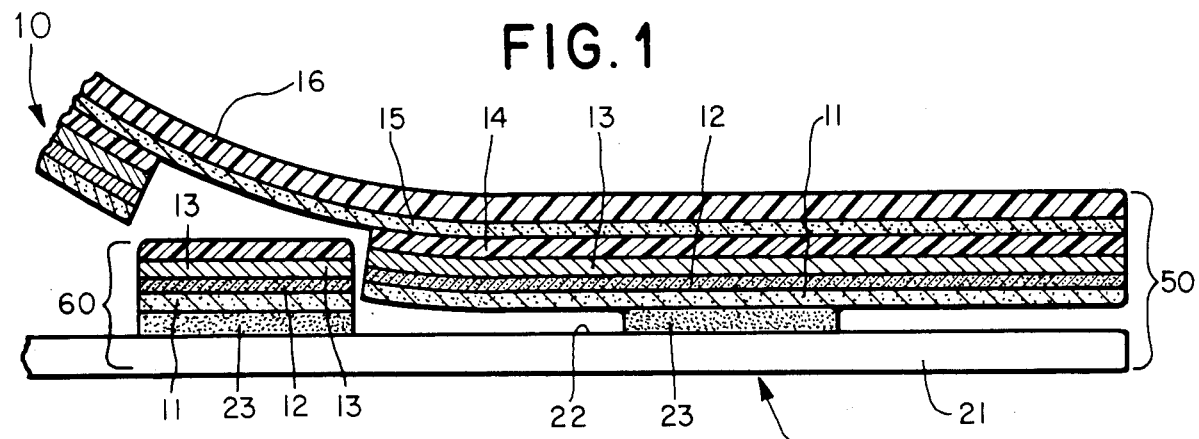
FIG. 1 shows a diagrammatic cross-sectional view of a colored metal transfer sheet and receiving substrate in use in a preferred embodiment of the present invention.

Turning now to the drawings, FIG. 1 shows a presently preferred transfer sheet indicated generally as 10, and a receiving substrate, such as paper, indicated generally as 20. The transfer sheet 10 of the preferred embodiment shown in FIG. 1 includes an adhesive 11, a primer 12, a metallic film 13, a clear or colored polymer coat 14, a release coat 15 and a carrier film 16. The receiving substrate 20 of this preferred embodiment comprises a sheet of paper 21 including an enamel treated surface 22 and xerographic images 23 thereon. For the purposes of this disclosure and the following claims, the term "xerographic images" is to be broadly construed to include clear or pigmented polymer powders deposited by the xerographic or other electrostatic image-forming processes. For example, such "xerographic images" might include polymer powders deposited by only the first four steps of the xerographic process described above in the Background of the Invention, while the fifth step may be omitted.

Alternate, less preferred embodiments are contemplated in which various ones of the components shown in FIG. 1 may be omitted or substituted. For example, the transfer sheet 10 may be constructed to include only the metallic film 13 and the carrier film 16; likewise, the enamel treated surface 22 of the receiving substrate 20 may be omitted, with only an untreated sheet of paper 21 to be used instead. Moreover, the sheet of paper 21 may be substituted with any other sheet material capable of holding xerographic images while being non-adherent with respect to the adhesive 11 (or the metallic film 13, in the absence of any adhesive 11 or primer 12). For example, a polyester film treated with a high-melting acrylic primer (which has a softening point higher than that of the xerographic toner), can be substituted for the sheet of paper 21.

Figure 2:
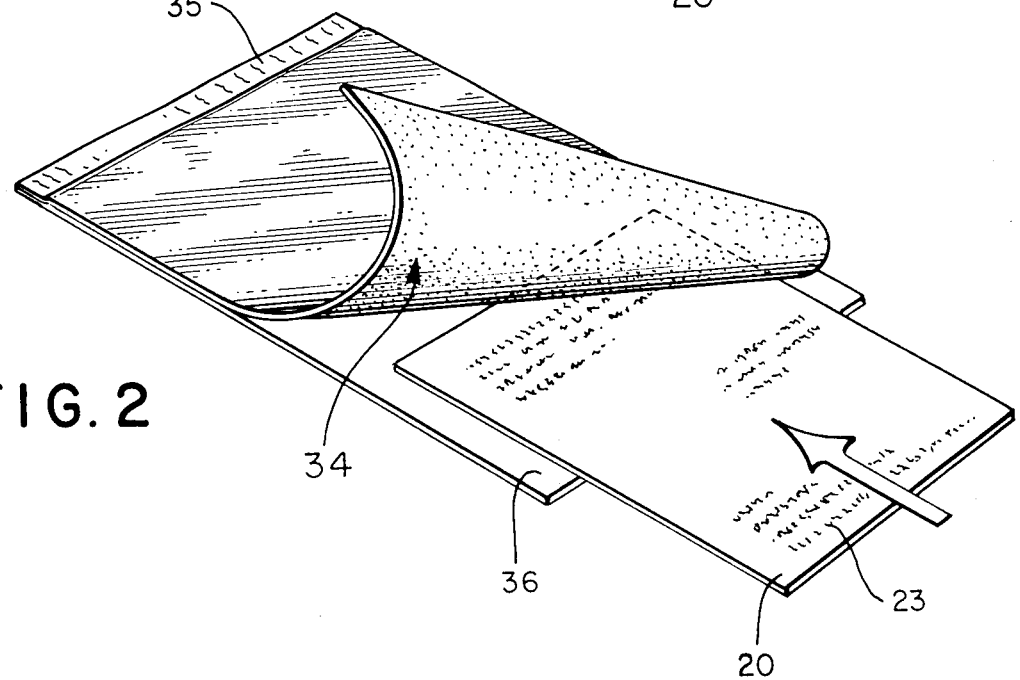
FIG. 2 shows a diagrammatic perspective view of a transfer sheet assembly and receiving substrate for use in a second preferred embodiment of the present invention.
Figure 3:
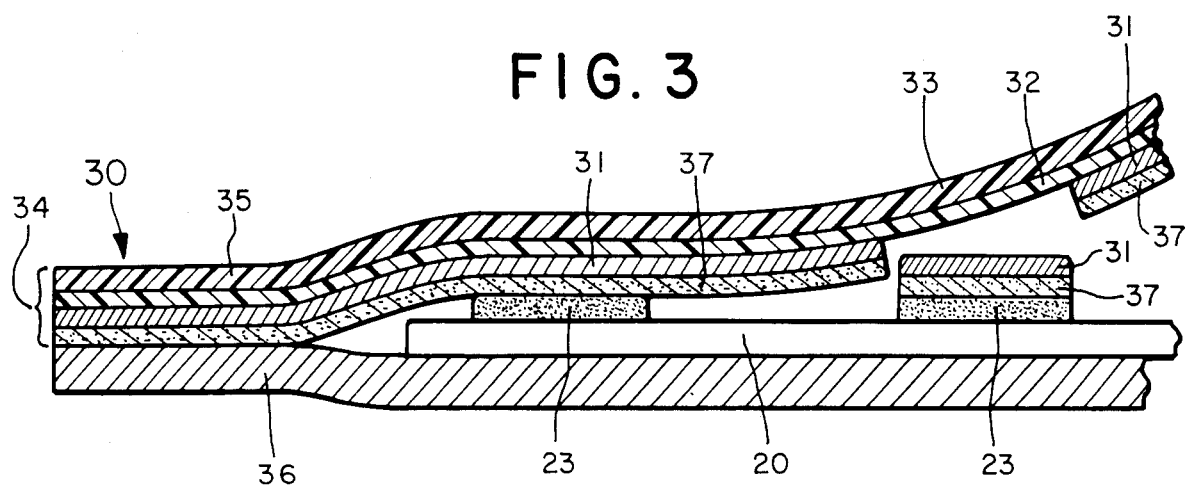
FIG. 3 shows a diagrammatic cross-sectional view of the transfer sheet assembly and receiving substrate of FIG. 2 in use in the second preferred embodiment of the present invention.

FIGS. 2 and 3 illustrate a transfer sheet assembly, indicated generally as 30, to be used in a second preferred embodiment of the invention. The transfer sheet assembly 30 of FIG. 3 includes a vacuum deposited metallic film 31 disposed upon a clear or colored polymer film 32, such as, for example, an acrylic film like methyl methacrylate or a methacrylate or a methacrylate copolymer, which is in turn disposed upon a polyester carrier 33. An adhesive layer 37 preferably coats the metallic film 31 on the opposite side from the clear polymer film 32. The metallic film 31, adhesive layer 37, polymer film 32 and the polyester carrier 33 together form a transfer sheet 34 that is adhered at an upper edge to a backing sheet 36. As shown in FIG. 2, the transfer sheet 34 may be attached to the backing sheet 36 by a piece of pressure sensitive tape 35.

When the transfer sheet assembly 30 is provided with a backing sheet 36 as seen in FIGS. 2 and 3, the receiving substrate is positioned in between the transfer sheet 34 and the backing sheet 36 (as expressly shown in FIG. 2). Correspondingly the transfer sheet 10 may be in the form of a roll (see, e.g., FIG. 4), or may be used to make transfer sheet assemblies such as the one depicted in FIG. 2.

In use, the transfer sheet 10 or the transfer sheet 34 is placed in face-to-face contact with the receiving substrate 20 to form a sandwich 50 with the xerographic images 23 on the inside, as seen in FIGS. 1 and 3. Heat and pressure are applied to the sandwich 50, causing the xerographic images 23 to become tacky and causing the metallic foil to selectively adhere to the images 23. the unadhered portion of the transfer sheet 10 or the transfer sheet assembly 30 is then stripped away from the resulting decorated sheet 60 comprising the xerographic images 23 overlaid with the metal film 13 or 31.

Figure 4:
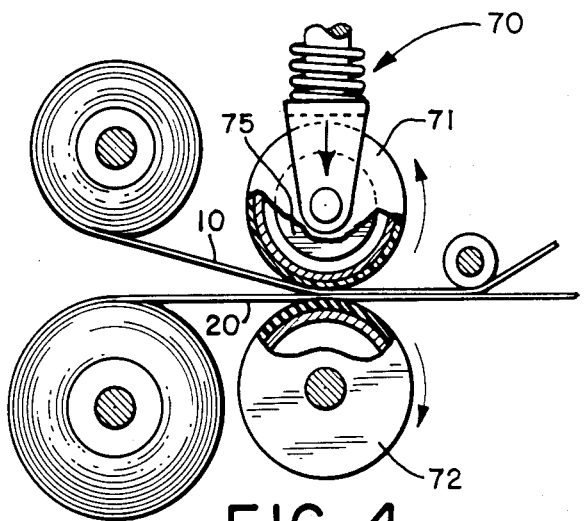
FIGS. 4 through 8 show various apparatus with which the various embodiments of the method of the present invention can be performed.
Figure 5:
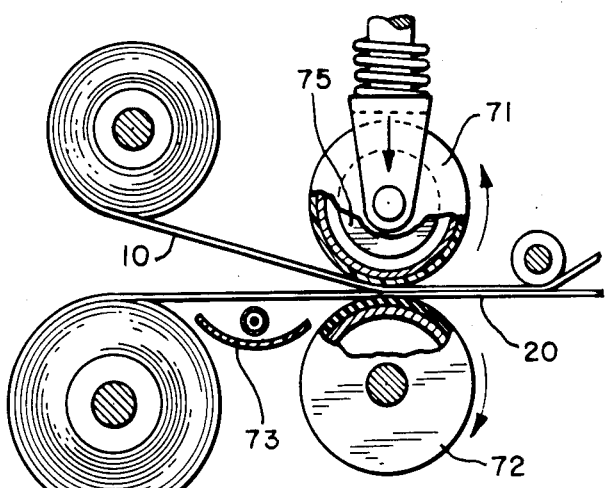
Figure 6:
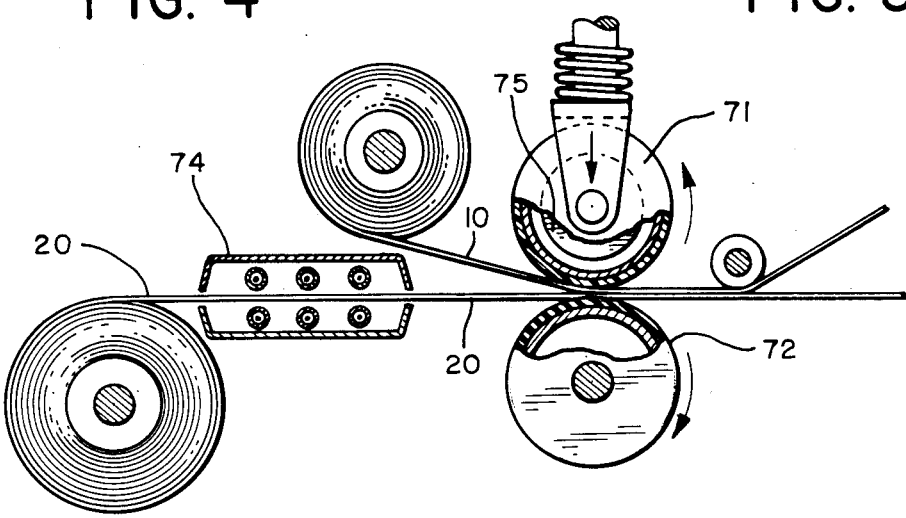
Figure 7:
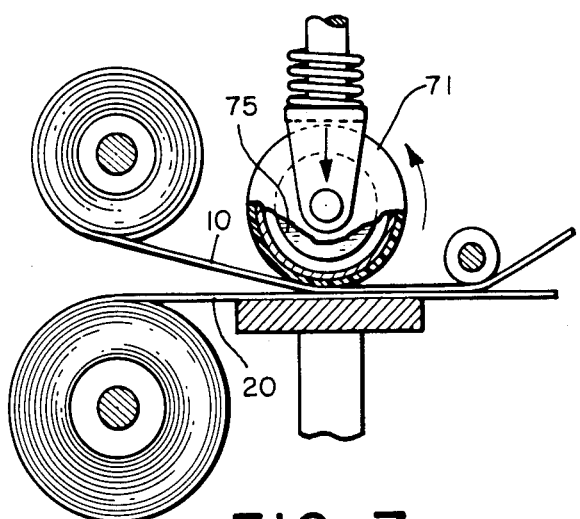
Figure 8:
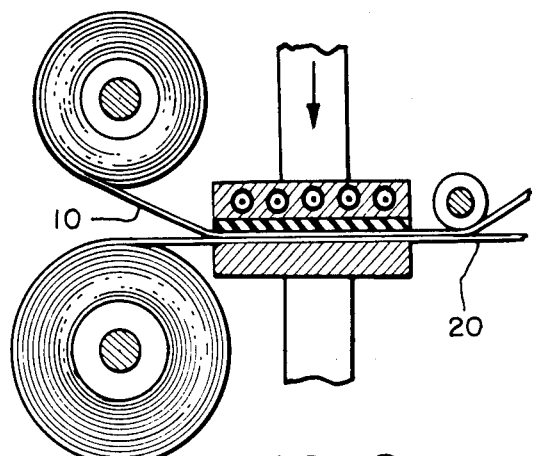

Various means can be used to apply pressure and temperature in accordance with the present invention, examples of which are given in FIGS. 4 through 8. Each apparatus in the drawings includes a pair of elements for the application of pressure to the sandwich 50 (formed from the transfer sheet 10 or the transfer sheet assembly 30, and the receiving substrate 20), and heating means which can be included in one of the pressure application elements and/or upstream the pair of pressure application elements. It is generally preferred that at least one of the pair of pressure application elements be formed of a resilient material at least at the area where contact is to be made with the transfer sheet 10 or transfer sheet assembly 30, to ensure the desired conformity of opposing surfaces of the pair as the sandwich passes therethrough. The apparatus shown in FIG. 4 represents the presently preferred means for performing these pressure application and heating functions, and will be more fully discussed below. The apparatus shown in FIGS. 5 and 6 are similar to that shown in FIG. 4, but include preheating means upstream the pair of pressure application elements: FIG. 5 includes a heat lamp 73 and FIG. 6 includes an oven 74. Such preheating means can be used to pre-heat the entire sandwich 50 (i.e., the combined transfer sheet 10 or assembly 30 and receiving substrate 20), or to simply pre-heat the receiving substrate 20. Embodiments including such pre-heating means are expected to be highly advantageous in that the rate of travel of the transfer sheet 10 or the transfer sheet assembly 30 will be increased, since it will not be necessary to maintain as great a dwell time in the pressure applying portions of the apparatus in order to achieve the desired temperature in the xerographic images.

In the presently preferred embodiment, the heat and pressure are applied by passing the sandwich 50 through a pair of rollers 70, as shown in FIGS. 4. The pair of rollers 70 comprises a first roller 71, made, for example, from Teflon coated aluminum, and a second roller 72, made, for example, from silicone rubber or having a silicone rubber surface. In this presently preferred embodiment, the first roller 71 is heated by heater 75 to a temperature in the range of from about 200 to about 375 degrees Fahrenheit, and most preferably a temperture of about 350 degrees Fahrenheit. The applied pressure is preferably in the range of from about 1 to about 20 pounds per square inch, and most preferably about 11 pounds per square inch. The pressure is applied to a contact area that is preferably of about 0.05 to about 0.3 square inches per inch of line contact, and most preferbly about 0.15 square inches per inch of line contact. This contact area exists due to the slight flattening deformation of the silicone rubber roller 72, which has a hardness in the preferred range of from about 40 to about 80 durometers, and most preferably in the ranage of from about 50 to about 60 durometers. The presently preferred contact or dwell time is in the range of from about 0.01 to about 0.4, and most preferably is about 0.09 seconds, such that the sheet feed rate is preferably in the range of from about 25 to about 500 inches per minute, and most preferably approximately 100 inches per minute. For the purpose of the present invention, "dwell" or "contact" time is the period of time during which pressure is applied to the portion of the sandwich in contact with the pair of rollers 70 (or other pressure-applying element) to develop adhesion to the toner and effect transfer. These parameters have been developed in the presently preferred embodiments because of the excellent results they produce when used with the presently preferred transfer sheet 10 and transfer sheet assembly 30, each of which will now be described in detail.

The presently preferred embodiment of the transfer sheet 10 includes each of the components shown in FIG. 1. It has been discovered that an improved transfer sheet and sheet assembly can be made using a large amount of a large particle size filler in the adhesive layer 11 or 37. The amount and type of filler is important to provide good coverage when making a transfer to a substrate with small, intricate area to be selectively covered by the metal layer 13 or 31. For example, if a substrate has a xerographic image made from a typewritten document, the small openings in certain letters (o, a, e, etc.) have a tendency to fill in if the transfer provides good bridging. However, if the tensile strength of the transfer layer is reduced to prevent such fill in, then the letters which are not well defined may be covered in a spotty fashion.

In the preferred embodiment of the metal or color transfer assembly, the adhesive layer is made from one part acrylic resin, two parts vinyl chloride vinyl acetate copolymr, and four parts titanium dioxide 93 parts isopropyl acetate are used as a carrier to mix the materials and to help coat the back of the transfer layer by a roto-gravure or wire wound doctor rod process. One tenth part of carbon black may also be used in the adhesive composition to provide a "grey" cast to the adhesive where such a coloring is needed. It can be seen that the resin:solids ratio is approximately 3:4. The preferred particulate is 0.5 micron or larger in size. A suitable particulate is DuPont R100. A suitable acrylic resin is Aroset 1044-Z-40 from Ashland Chemical Co. A suitable vinyl chloride vinyl acetate copolymer is Union Carbide VMCC.

The improved adhesive layer allows for consistent, high resolution coverage using the short dwell times specified above. One method by which the adhesive layer produces such exceptional results is that the adhesive layer provides controlled bridging in the transfer layer by reducing the tensile strength of the adhesive layer and propagating a crack in the adhesive layer (between a surface to be covered by the transfer and adjacent surfaces not to be covered) through the metal film layer. This provides better resolution in the transfer, but controls bridging. The adhesive layer described provides opacity to the transferred layer, especially where the layer 13 or 31 is a very thin metal layer to be affixed to a dark colored xerograph image. Also, the opacity masks streaks in the vacuum deposited metal layer, which is difficult to form uniformly.

The improved adhesive layer also provides increased "surface area" for adhesion. When xerographic reproductions have a thin film of silicone oil on the surface of the toner to prevent the toner from adhering to other parts inside the machine, the silicone prevents the adhesive from adhering to the toner image. The large amounts of particulate used in the preferred embodiment of the invention increases the effective surface area of the adhesive layer, allowing any silicone to fill interstitial voids between particles at the surface and putting some "teeth" into the adhesive layer.

The primer 12 is made from vinyl chloride/vinyl acetate/maleic acid copolymer. Such a material can be obtained from Union Carbide as ACAR ® Grade UMCH. The metallic film 13 can be made from any of a variety of metals, such as aluminum, copper, chromium, tin, silver and gold, and the like, and in the preferred embodiment is made by vacuum deposition onto methyl methacrylate to a thickness preferably just approaching but not attaining optical opacity. Such vacuum deposited films can be obtained from Gomar Mfg. Co. of Linden, N.J. The presently preferred release coat 15 is made from an ethylene vinyl acetate copolymer. Such a material can be obtained from DuPont as ELVAX-40. Finally, the presently preferred carrier film 16 is made from polyester film (extruded and oriented polyethylene terephthalate, having a thickness in a range of 0.4 to 2 mils). Such a material can be obtained from ICI America as 0.5 mil type H film. The polymer coats 14 can be applied from an isopropyl acetate solution, while the primer 12 can be applied from a methyl ethyl ketone solution and the described release coat 15 can be applied from a toluol solution. An ideal composite film thickness (i.e., the combined thickness of all coating components except for the carrier film 16) has been found to be in the range of from about 0.02 mils to about 0.06 mils, and is optimally about 0.03 mils. Thicker composite films give decreased image resolution, while thinner composite films lose their integrity upon transfer and induce undesirable optical effects.

It should be understood that the materials and details of construction of the foregoing detailed description are given only by way of illustration, and not limitation. These materials and details of construction can be varied to suit individual applications within the scope of this invention, as will be apparent to one of ordinary skill in the art. For example, the metal need not be vacuum deposited, but can be applied to a coating by the equivalent processes of silver reduction, organic solvent deposition, or the like. Moreover, the polymer coatings can be applied from waterbased solutions or dispersions. Accordingly, it is intended that the following claims and all equivalents thereof, and not the foregoing detailed description, be taken to define the scope of this invention.

I claim:

1. A selective transfer process comprising the steps of:
   providing a sheet comprising toner xerographic images and a metal transfer sheet comprising, in successive layers, a carrier, a metallic film and an adhesive;
   placing the sheet comprising toner xerographic images in face-to-face contact with the foil transfer sheet to form a sandwich with the toner xerographic images on the inside;
   applying heat and pressure to the sandwich to cause the toner xerograhic image to become tacky and the metallic film to selectively adhere to the images, resulting in a decorated sheet; and
   stripping the foil transfer sheet away from the decorated sheet.

2. The process of claim 1 comprising the additional step of preheating the sheet comprising toner xerographic images before the step of applying heat and pressure to the sandwich.

3. The process of claim 1 wherein the heat is applied at a temperature in a range of from about 200 to about 375 degrees Fahrenheit.

4. The process of claim 3 wherein the heat is applied at a temperature of about 350 degrees Fahrenheit.

5. The process of claim 1 wherein the pressure is applied in a range of from about 1 to about 20 pounds per square inch.

6. The process of claim 5 wherein the pressure is applied at about 11 pounds per square inch.

7. The process of claim 1 wherein the metal transfer sheet is made by vacuum depositing metal on a polymer backing.

8. The process of claim 7 wherein the metal is one of the group consisting of aluminum, copper, tin, silver and gold.

9. The process of claim 1 wherein the metal transfer sheet is attached to a backing sheet, and the sheet comprising toner xerographic images is placed between the backing sheet and transfer sheet.

10. The process of claim 1 further comprising the steps of:
    providing a pair of rollers adapted to apply heat and pressure to the sandwich; and
    passing the sandwich through the paid of rollers.

11. The process of claim 10 further comprising the step of providing a dwell time of about 0.01 to 0.4 seconds.

12. The process of claim 10 wherein the sandwich is passed through the rollers at a rate of about 100 inches per minute.

13. The process of claim 10 wherein the pair of rollers comprises a rigid roller element and a roller element comprising a flexible surface.

14. The process of claim 13 wherein the flexible rubber element is constructed with a silicone rubber surface.

15. The process of claim 13 wherein the flexible roller element has a surface hardness in a range of from about 40 durometers to about 80 durometers.

16. The process of claim 10 wherein:
    the pair of rollers comprises a flexible roller element having a surface hardness in a range of from about 40 to about 80 durometers;
    the sandwich is permitted to contact the rollers at a rate in a range from about 25 to 500 inches per minute; and
    heat is applied to the sandwich at a temperature in a range from about 200 to 375 degrees Fahrenheit simultaneously with the formation of contact between the sandwich and the rollers.

17. A selective transfer process comprising the steps of:
    providing a metal transfer sheet comprising, in layers, a carrier film, a release coat, a polymer film, a metallic film and an adhesive;
    providing a receiving substrate comprising a toner xerographic image;
    placing the receiving substrate in face-to-face contact with the foil transfer sheet;
    while the receiving substrate and the foil transfer sheet are in face-to-face contact, applying heat and pressure to at least one of the receiving substrate and metal transfer sheet to cause the toner xerographic image to become tacky and cause the metal film to adhere to the toner xerographic image, and to thereby cause the formation of a decorated receiving substrate; and
    stripping away the metal transfer sheet from the decorated receiving substrate.

18. The process of claim 17 wherein the metal transfer sheet is attached to a backing sheet, and the substrate comprising a toner xerographic image is placed between the backing sheet and the metal transfer sheet.

19. The process of claim 17 wherein said adhesive contains a resin and a dispersion of 0.5 micron or larger particulate material in a ratio of at least 1 part particulate material to one part resin.

20. The process of claim 19 wherein the particulate comprises titanium oxide at a ratio of about 4 parts titanium oxide to three parts resin.

* * * * *

UNITED STATES PATENT AND TRADEMARK OFFICE
CERTIFICATE OF CORRECTION

PATENT NO. : 4,724,026
DATED : February 9, 1988
INVENTOR(S) : Marshall A. Nelson Page 1 of 3

It is certified that error appears in the above-identified patent and that said Letters Patent is hereby corrected as shown below:

On the title page:

IN THE REFERENCES CITED

After "4,006,267 2/1977", please delete "Kunz" and substitute therefor --Kurz--.

IN THE ABSTRACT

On line 2, please delete "and" and substitute therefor --to--.

On line 9, please delete "the" and substitute therefor --The--.

IN THE CROSS REFERENCE TO RELATED APPLICATION

In column 1, line 10, before "abandoned", please insert --now--.

IN THE BACKGROUND OF THE INVENTION

In column 1, line 38, please delete "knonw" and substitute therefor --known--.

In column 1, line 55, please delete "Harahara" and substitute therefor --Hirahara--.

In column 2, line 29, please delete "or" and substitute therefor --of--.

UNITED STATES PATENT AND TRADEMARK OFFICE
CERTIFICATE OF CORRECTION

PATENT NO. : 4,724,026
DATED : February 9, 1988
INVENTOR(S) : Marshall A. Nelson It is certified that error appears in the above-identified patent and that said Letters Patent is hereby corrected as shown below:

IN THE SUMMARY OF THE INVENTION

In column 2, line 39, please delete "imamges" and substitute therefor --images--.

IN THE DETAILED DESCRIPTION OF THE PREFERRED EMBODIMENTS

In column 4, line 33, please delete "the" and substitute therefor --The--.

In column 5, line 6, please delete "FIGS." and substitute therefor --FIG.--.

In column 5, line 14, please delete "temperture" and substitute therefor --temperature--.

In column 5, line 25, please delete "ranage" and substitute therefor --range--.

In column 5, line 49, please delete "area" and substitute therefor --areas--.

In column 5, line 61, please delete "copolymr" and substitute therefor --copolymer--.

In column 5, line 61, after "dioxide", please add -- . --.

In column 5, line 61, please delete "93" and substitute therefor --Ninety-three--.

UNITED STATES PATENT AND TRADEMARK OFFICE
CERTIFICATE OF CORRECTION

PATENT NO. : 4,724,026
DATED : February 9, 1988
INVENTOR(S) : Marshall A. Nelson It is certified that error appears in the above-identified patent and that said Letters Patent is hereby corrected as shown below:

In column 6, line 35, please delete "ACAR" and substitute therefor --UCAR--.

IN THE CLAIMS

In column 7, line 22, please delete "xerograhic" and substitute therefor --xerographic--.

In column 8, line 52, please delete "1" and substitute therefor --one--.

In column 8, line 55, please delete "oxide" and substitute therefor --dioxide--.

In column 8, line 56, please delete "oxide" and substitute therefor --dioxide--.

Signed and Sealed this

Seventh Day of January, 1992

Attest:

HARRY F. MANBECK, JR.

*Attesting Officer*   *Commissioner of Patents and Trademarks*